United States Patent [19]

Baerg et al.

[11] Patent Number: 4,700,454
[45] Date of Patent: Oct. 20, 1987

[54] PROCESS FOR FORMING MOS TRANSISTOR WITH BURIED OXIDE REGIONS FOR INSULATION

[75] Inventors: William Baerg, Palo Alto; Chiu H. Ting, Saratoga; Byron B. Siu; J. C. Tzeng, both of Sunnyvale, all of Calif.

[73] Assignee: Intel Corporation, Santa Clara, Calif.

[21] Appl. No.: 794,524

[22] Filed: Nov. 4, 1985

[51] Int. Cl.[4] .................. H01L 21/265; H01L 21/16; H01L 21/28; H01L 21/316

[52] U.S. Cl. .................................. 437/24; 357/23.7; 357/23.8; 437/41; 437/235

[58] Field of Search .............. 29/569 R, 571, 576 W, 29/576 B; 148/1.5; 357/23.7, 26.6, 23.8

[56] References Cited

U.S. PATENT DOCUMENTS

| | | | |
|---|---|---|---|
| 3,855,009 | 12/1974 | Lloyd | 148/1.5 |
| 4,105,805 | 8/1978 | Glendinning | 29/576 B |
| 4,282,648 | 8/1981 | Yu | 29/576 W |
| 4,412,868 | 11/1983 | Brown | 29/576 W |
| 4,523,213 | 6/1985 | Konaka et al. | 357/23.12 |

FOREIGN PATENT DOCUMENTS 1601676 2/1978 United Kingdom .

OTHER PUBLICATIONS

*Electronics Letters,* pp. 593–594, Aug. 78, vol. 14, No. 18, K. Izumi et al., "CMOS Devices Fabricated on Buried SiO$_2$ Layers Formed by Oxygen Implantation into Silicon".

*VLSI Fabrication Principles,* by S. K. Ghandhi, John Wiley & Sons, pp. 352, 359–361, 437.

*Japanese J. of Applied Physics,* vol. 21, No. 5, May 1982, pp. 744–751, Satoshi Maeyama et al.

*Japanese J. of Applied Physics,* vol. 20, No. 12, Dec. 1981, pp. L909–L912, Yukio Irita et al.

Primary Examiner—Brian E. Hearn
Assistant Examiner—Chi-Tso Huang
Attorney, Agent, or Firm—Blakely, Sokoloff, Taylor & Zafman

[57] ABSTRACT

MOS process for forming field-effect devices in self-alignment with a buried oxide region. Oxygen is implanted in alignment with masking members after gates have been defined from the masking members. The masking members block the oxygen implantation and thus the channel regions of subsequently formed transistors are self-aligned with openings in the buried oxide layer.

12 Claims, 6 Drawing Figures

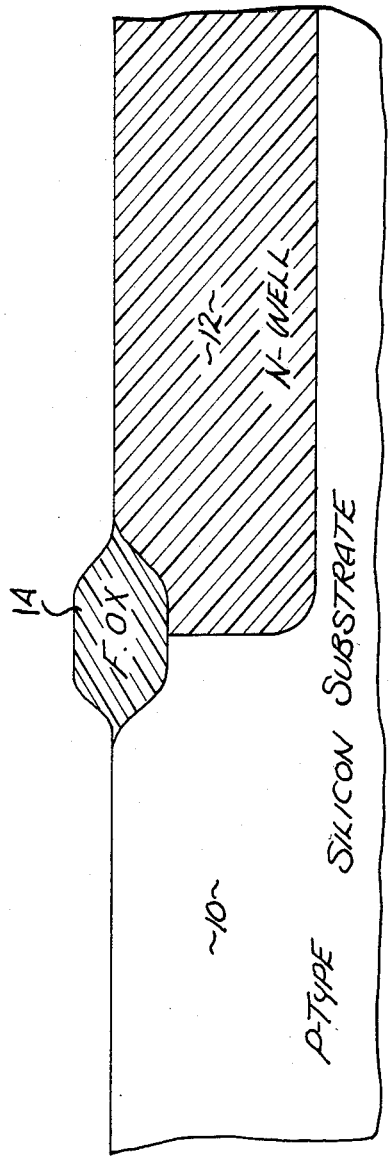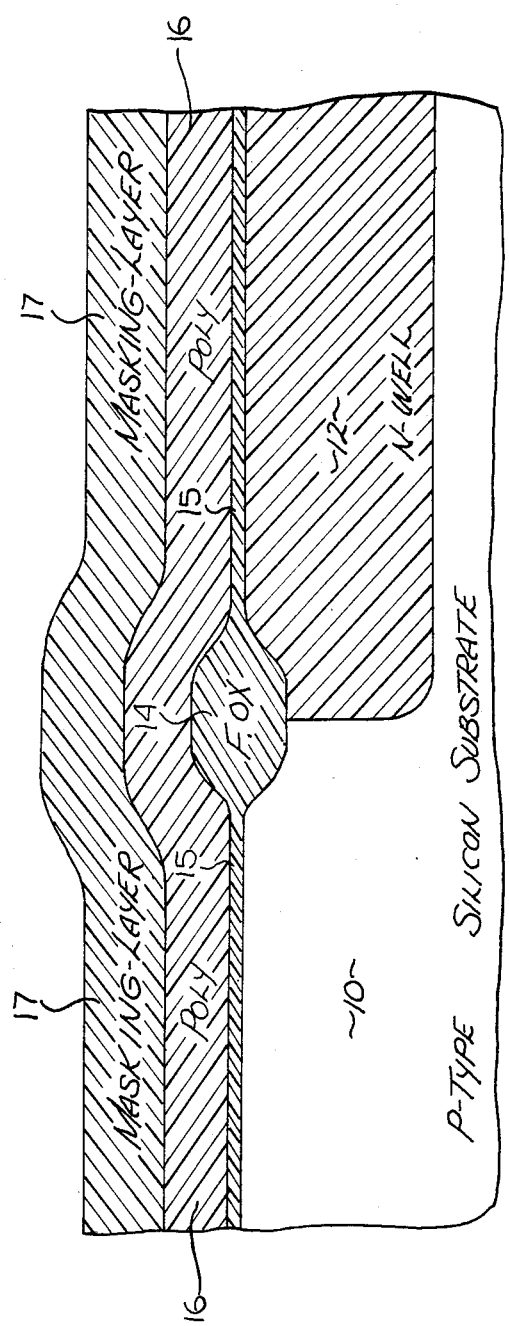

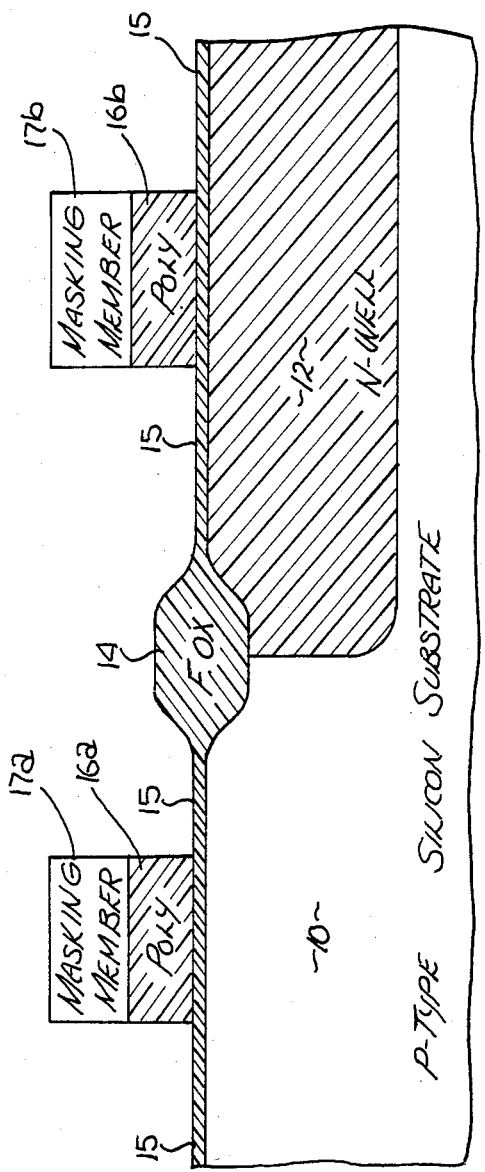
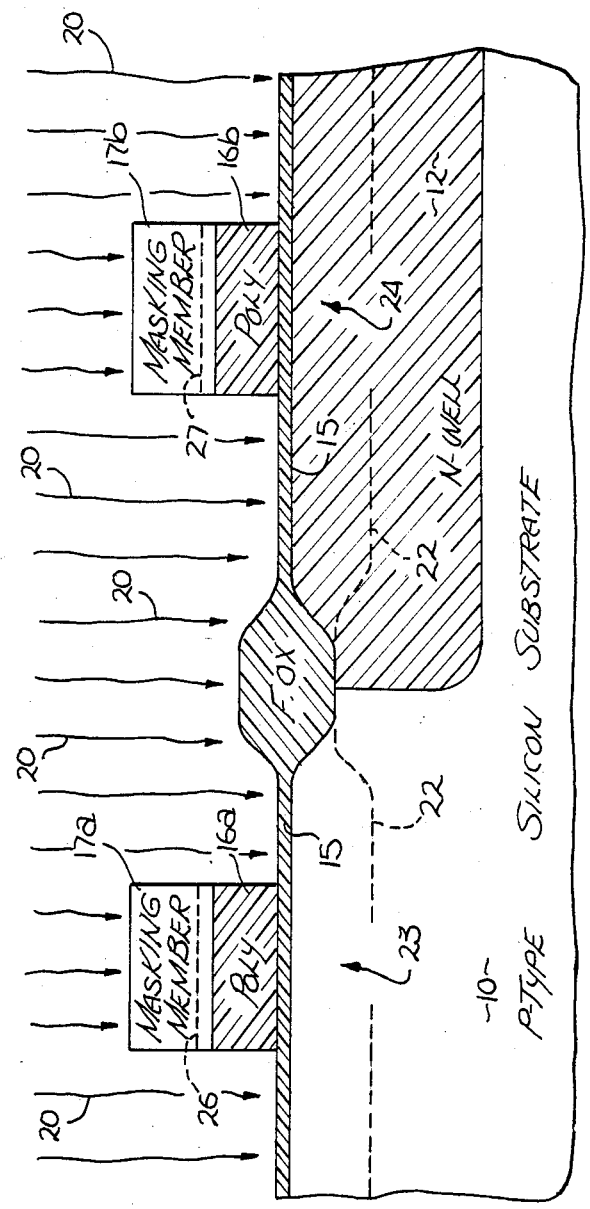

PROCESS FOR FORMING MOS TRANSISTOR WITH BURIED OXIDE REGIONS FOR INSULATION

BACKGROUND OF THE INVENTION

1. Field of the Invention.

The field of the invention relates to the field of MOS transistor fabrication where a buried oxide layer is employed.

2. Prior Art.

Recently a process has been described for forming a buried insulative layer in silicon by implanting oxygen ions. See "Electrical Characteristics of Oxygen Implanted Silicon Substrates", *IEDM* 84 beginning at page 804 by Foster, Butler and Bolbot. This technique has been used to form a continuous insulative layer which is formed below the surface of the substrate. Transistors are then formed above this buried oxide region. While there are several advantages to this structure, it also has several problems. First, the silicon above the buried layer has a very high defect density (e.g., $10^9/cm^2$) as a result of the damage caused by the implanted oxygen ions. The upper surface of the silicon is also roughened by the implantation, this degrades the carrier mobility at the interface of the gate oxide and degrades the gate oxide. Another disadvantage to this structure is that the channel regions of the transistors are electrically isolated from the silicon by the continuous buried insulative layer causing junctions to become forward biased with the result that the channel conductance is no longer controlled by the gate electrode.

In one prior art process an epitaxial-like silicon layer is formed over insulative regions. The resultant structure resembles a buried oxide region, however, with openings through the buried insulative layer at the site of the channel regions. This places the channel regions in electrical contact with the substrate and overcomes some of the disadvantages mentioned above. The openings in the insulative layer are used as seed windows to propagate the monocrystalline structure of the substrate into a polysilicon layer, thereby forming the epitaxial-like layer over the insulative regions. One problem with this structure is that the openings in the insulative layer are not self-aligned with the channel regions of the transistors. That is, the gate electrode mask is optically aligned to the openings on the silicon wafer by photolithographic equipment. The misalignment tolerance for this procedure is currently approximately plus or minus 0.25 microns. For channel lengths below 1 micron, this misalignment can be a problem. This process is described in copending applications entitled "Process for Forming Isolated Silicon Regions in Field-Effect Devices on a Silicon Substrate", Ser. No. 700,607, filed Feb. 11, 1985, and assigned to the assignee of the present invention.

As will be seen, the invented process provides a structure which has some of the advantages of the above described process and structures without some of their disadvantages.

Other references dealing with oxygen implantation into silicon are: "CMOS DEVICES FABRICATED ON BURIED SiO2 LAYERS FORMED BY OXYGEN IMPLANTATION INTO SILICON", *Electronics Letters*, pages 593–594, Aug. 31, 78, Vol. 14, No. 18, by K. Izumi, M. Doken, and H. Ariyoshi; "FORMATION OF ABRUPT INTERFACES BETWEEN SURFACE SILICON AND BURIED SIO2 LAYERS BY VERY HIGH DOSE OXYGEN-ION IMPLANTATION", *Japanese Journal of Applied Physics*, pages 1005–1006, Vol. 19 (1980), No. 5, by Takayoshi Hayashi, Hamao Okamoto and Yoshikazu Homma; "CHARACTERISTICS OF MOSFETS FABRICATED IN SILICON-ON-INSULATOR MATERIAL FORMED BY HIGH-DOSE OXYGEN ION IMPLANTATION", *Electronics Letters*, pages 356–358, May 14, 1981, Vol. 17, No. 10, by H. W. Lam, R. F. Pinnizzotto, H. T. Yuan, and D. W. Bellavance; "MULTIPLE SOI STRUCTURE FABRICATED BY HIGH DOSE OXYGEN IMPLANTATION AND EPITAXIAL GROWTH", *Japanese Journal of Applied Physics*, Vol. 20, No. 12, December 1981, pages 909–912, by Yukio Irita, et al; "SIMOX TECHNOLOGY FOR CMOS LSIs", 1982 *Symposium on VLSI Technology*, Kanagawa, Japan by Katsutoshi Izumi, et al; "FORMATION OF OXIDE LAYERS BY HIGH DOSE IMPLANTATION INTO SILICON", *Mat. Res. Soc. Symp. Proc.* Vol. 27 (1984) by S. S. Gill and I. H. Wilson; "CHARACTERISATION OF DEVICE GRADE SOI STRUCTURES FORMED BY IMPLANTATION OF HIGH DOSES OF OXYGEN", *Mat. Soc. Symp. Proc.* Vol. 27 (1984) by P. L. F. Hemment et al.

SUMMARY OF THE INVENTION

A process for forming transistors on a silicon substrate with underlying buried insulative regions is described. Gate members are formed on the substrate with each gate member being covered with a masking member. By way of example, ordinary processing may be used to form polysilicon gates with the masking members comprising photoresist. The substrate is subjected to an ion implantation step with ions which combine with the silicon to form an insulative region. These ions are blocked from the substrate by the masking members, thereby forming a buried insulative layer in the substrate with openings which are in alignment with the gate members. Again, by way of example, oxygen may be implanted into the substrate followed by an annealing step to form the buried insulative regions. Source and drain regions are then formed in the substrate in alignment with the gate members providing the field effect transistors.

BRIEF DESCRIPTION OF THE DRAWINGS

FIG. 1 is a cross-sectional elevation view of a silicon substrate which includes an n-well and a field oxide region.

FIG. 2 illustrates the substrate of FIG. 1 after the formation of an insulative layer, a polysilicon layer and a photoresist layer.

FIG. 3 illustrates the substrate of FIG. 2 after a masking and etching step to form masking members and gate members.

FIG. 4 illustrates the substrate of FIG. 2 during an implantation step.

DETAILED DESCRIPTION OF THE INVENTION

Figure 5:
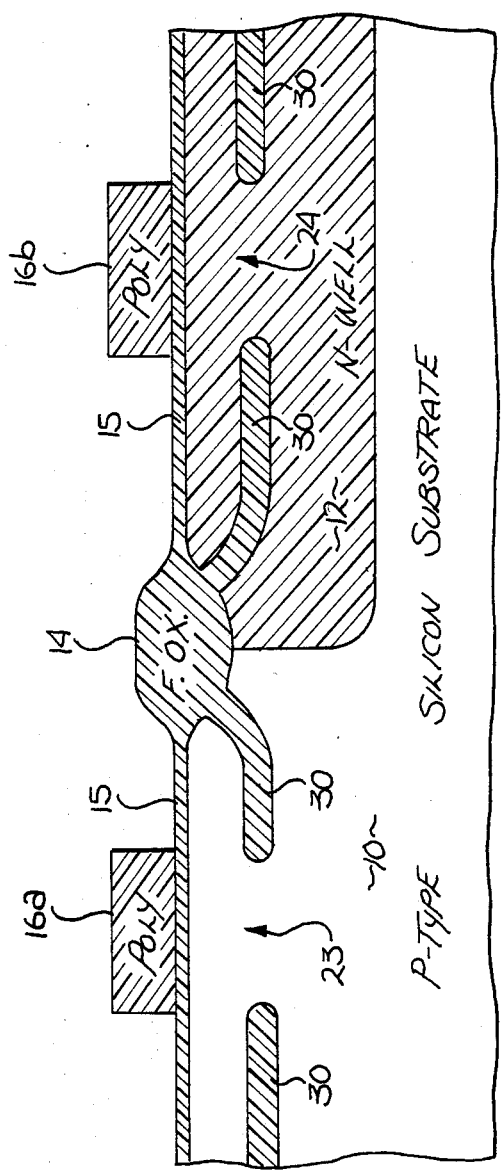
FIG. 5 illustrates the substrate of FIG. 4 after annealing.

A process is disclosed for forming metal-oxide-semiconductor (MOS) field effect devices on a silicon substrate where a buried insulative layer is formed below the devices. In the following description, numerous specific details are set forth such as specific ions and energy levels in order to provide a thorough understanding of the present invention. It will be obvious, however, to one skilled in the art that the present invention may be practiced without these specfic details. In other instances, well-known processing steps such as cleaning steps, etc., have not been set forth in order not to unnecessarily obscure the present invention.

The following description describes the formation of complementary MOS (CMOS) transistors. It will be apparent that the process may be used to form only n-channel or p-channel transistors or other types of devices.

Referring to FIG. 1, a p-type silicon substrate 10 is illustrated with an n-well 12. A field oxide region 14 is shown at the edge of the well. Other channel stops, etc., that may be employed are not illustrated in the drawings since they are well-known. The n-well 12 and field oxide region 14 may be formed using ordinary processing.

Next an insulative layer 15 is formed on the substrate 10 as shown in FIG. 2. By way of example, an ordinary silicon dioxide layer (gate oxide) is grown on the substrate. Then a polysilicon layer 16 is formed on the layer 15 using conventional methods. This layer may be doped (e.g.,phosphorus doped). Now a masking layer 17 is formed over the polysilicon layer 16 and patterned to define gate members using ordinary photolithographic techniques. The resultant structure is shown in FIG. 3 with the photoresist masking members 17a and 17b formed from layer 17, and the polysilicon gate members 16a and 16b etched in alignment with the masking members from the polysilicon layer 16.

The substrate now is implanted with oxygen ions at sufficient energy to implant them, in the presently preferred embodiment, to approximately 0.35 to 0.5 microns below the gate oxide interface. By way of example, a dose of approximately $2 \times 10^{18}/cm^2$ of $0_{16}$ atoms implanted at an energy of 200 KEV may be used with the substrate temperature of approximately 500 degrees C during implantation. The implantation is illustrated in FIG. 4 by the lines 20. The presence of the implanted oxygen region within the substrate is shown by the dotted line 22. The masking members 17a and 17b are sufficiently thick to prevent the oxygen ions from being implanted into the substrate below the gate members. Thus, line 22 is broken at openings 23 and 24. Also, the photoresist members 17a and 17b are sufficiently thick to prevent the oxygen ions from reaching the polysilicon gate members. The implanted ions are shown by the dotted line 26 for the masking members 17a and the dotted line 27 for the masking member 17b. If, for instance, a hardened photoresist layer is used, 1 micron of thickness is sufficient to prevent penetration of the oxygen ions into the polysilicon members.

While in the presently preferred embodiment oxygen is employed, other ions that will react with silicon to form an insulative layer may be used; for instance, nitrogen to form a silicon nitride-like buried layer. As mentioned, a hardened photoresist layer may be used as a masking member, other masking members may be employed. By way of example, a photoresist layer may be used to form silicon nitride masking members which in turn are used to define the polysilicon gates. In this case, the photoresist and/or the silicon nitride are used to block the ions. In any event, the masking member should withstand the ion implantation. Therefore, a hardened photoresist layer should be used. In the case of silicon nitride, a high temperature film should be used or a refractory metal may be used.

The polysilicon itself may be used as a masking layer. An extra thick layer of polysilicon is formed and etched to define the gates. After the implantation, the upper portion of the layer (e.g., the portion containing the oxygen ions) is removed leaving the non-implanted polysilicon gates.

For the processing shown in FIG. 4, after the implantation, the masking members are removed. (If a refractory metal is used as a masking member, it may not be necessary to remove it, that is, the metal may remain as part of the gate structure.) The substrate is now subjected to an annealing step in an inert gas such as nitrogen. The substrate, for instance, is placed in a furnace at 1150 degrees C. for 160 minutes. The implanted oxygen reacts with the silicon to form the buried SiO2 layer 30 shown in FIG. 5.

Figure 6:
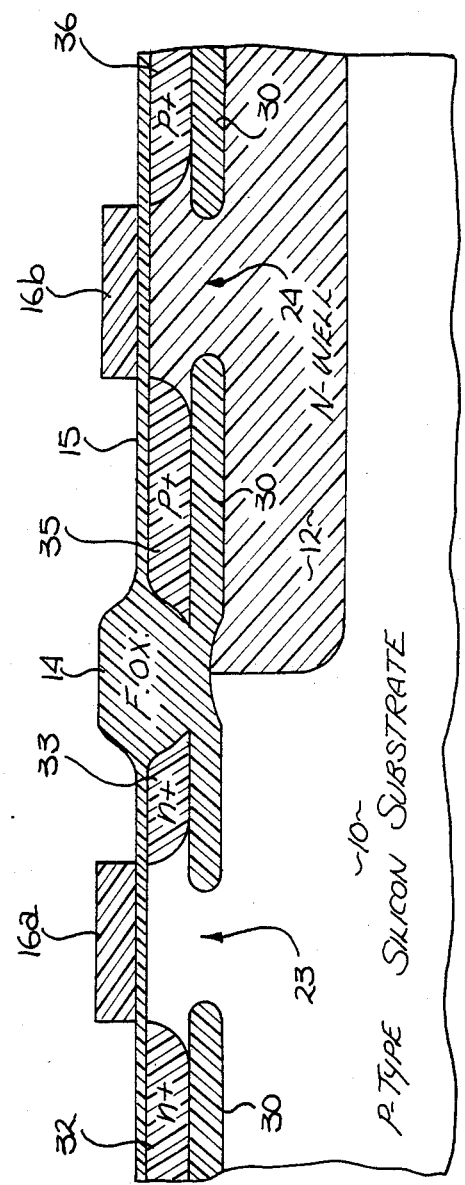
FIG. 6 illustrates the substrate of FIG. 5 after source and drain regions are formed in alignment with the gate members.

Finally, as shown in FIG. 6, conventional processing is used to form source an drain regions 32 and 33 in alignment with gate 16a and the regions 35 and 36 in alignment with gate 16b. This is commonly done, by for example, placing masking members over those regions that include n-channel transistors and then implanting a p-type dopant in alignment with the gate 16b to form the regions 35 and 36. Then a masking member is placed over the p-channel devices and an n-type dopant is implanted to form the regions 32 and 33.

It is important to note from the structure of FIG. 6 that the gate members are self-aligned with the openings 23 and 24 of the buried oxide 30. This overcomes one of the problems mentioned in the Prior Art Section where the epitaxial-like layer is grown through openings (seed windows). Another advantage to the structure of FIG. 6 is that the channels of the transistors are in electrical contact with the substrate, that is, they are not isolated. Importantly, the monocrystalline silicon regions which become the channels of the transistors are protected from the oxygen implantation (by the masking member) and thus the silicon is not damaged by the implantation. Also, there is no back channel region under the channels to cause the drain-to-source leakage in the off-state of the transistor. Another advantage is that the channel-gate oxide interface is protected from the surface damage caused by the oxygen implantation. This prevents the degradation in channel surface mobility and gate oxide quality described in the Prior Art Section of this application. The resultant structure for CMOS devices has reduced latch-up sensitivity, reduced junction capacitance and virtually no source/drain contact-to-substrate leakage.

Thus, a process has been described for forming MOS transistors in conjunction with a self-aligned buried insulative layer.

We claim:
1. A process for forming transistors on a silicon substrate comprising the steps of:
  forming gate members on said substrate;
  subjecting said substrate to ion implantation of an ion which combines with said silicon to form insulative regions in said substrate in alignment with said gate members, said gate members being sufficiently thick such that said implanted ions do not penetrate through said gate members, forming source and drain regions in said substrate in alignment with said gate members, and removing those portions of said gate members that have been implanted with said ions;

whereby transistors are formed in said substrate with insulative regions.

2. The process defined by claim 1 wherein said ions are ions of oxygen.

3. The process defined by claim 1 wherein said gate members comprise polysilicon.

4. The process defined by claim 2 wherein following said implantation an annealing step is used to form a buried silicon dioxide layer.

5. The process defined by claim 4 wherein said annealing step occurs in the presence of an inert gas.

6. A process for forming transistors on a silicon substrate comprising the steps of:

forming masking members over predetermined sites of said substrate; said forming of masking members comprising the forming of an insulative layer on said substrate and the formation of gate members over said insulative layer;

subjecting said substrate to an implantation of an ion which combines with said silicon to form an insulator, said implantation being blocked by said gate members, thereby forming a buried insulative layer having openings in alignment with said gate members, said gate members being sufficiently thick to prevent said ions from completely penetrating said gate members;

forming source and drain regions in said substrate in alignment with said gate members;

removing those portions of said gate members that have been implanted with said ions;

whereby transistors are formed in said substrate with a buried insulative layer.

7. The process defined by claim 6 wherein said ions comprise ions of oxygen.

8. The process defined by claim 7 including the step of annealing said substrate following said implantation to form said buried insulative layer which comprises silicon dioxide.

9. The process defined by claim 8 wherein said annealing occurs in the presence of an inert gas.

10. The process defined by claim 6 wherein said gate member comprises polysilicon.

11. A process for forming transistors on a silicon substrate comprising the steps of:

forming an insulative layer on said substrate;

forming a polysilicon layer over said insulative layer;

defining a plurality of masking means over said polsilicon layer;

forming a plurality of gate members from said polysilicon layer in alignment with said masking members;

subjecting said substrate to ion implantation of an ion which combines with said silicon to form an insulative region beneath the surface of said silicon substrate, said gate members being sufficiently thick to block said ions from completely penetrating said polysilicon gate members;

connecting said substrate to form a buried insulative region in said substrate from said ions and said silicon, said insulative region including openings formed in alignment with said gate members;

forming source and drain regions in said substrate in alignment with said gate members;

removing said masking members;

removing those portions of said gate members that have been implanted with said ions;

whereby transistors are formed in said substrate.

12. The process defined by claim 11 wherein said ions are ions of oxygen.

* * * * *